US 8,138,053 B2

(12) United States Patent
Utomo et al.

(10) Patent No.: US 8,138,053 B2
(45) Date of Patent: Mar. 20, 2012

(54) METHOD OF FORMING SOURCE AND DRAIN OF FIELD-EFFECT-TRANSISTOR AND STRUCTURE THEREOF

(75) Inventors: Henry K. Utomo, Newburgh, NY (US); Shailendra Mishra, Singapore (SG); Lee Wee Teo, Singapore (SG); Jae Gon Lee, Singapore (SG); Shyue Seng Tan, Singapore (SG)

(73) Assignees: International Business Machines Corporation, Armonk, NY (US); Global Foundries Inc., Grand Cayman (KY)

( * ) Notice: Subject to any disclaimer, the term of this patent is extended or adjusted under 35 U.S.C. 154(b) by 837 days.

(21) Appl. No.: 11/763,561

(22) Filed: Jun. 15, 2007

(65) Prior Publication Data

US 2008/0166847 A1     Jul. 10, 2008

Related U.S. Application Data

(60) Provisional application No. 60/884,080, filed on Jan. 9, 2007.

(51) Int. Cl.
*H01L 21/336*     (2006.01)

(52) U.S. Cl. ........ 438/300; 438/301; 438/302; 438/303; 257/E21.409; 257/E21.43; 257/E21.431

(58) Field of Classification Search .......... 438/300–305, 438/199, 522; 257/13, 79, 194, 499, E21.43, 257/E21.431, E21.409
See application file for complete search history.

(56) References Cited

U.S. PATENT DOCUMENTS

| | | | |
|---|---|---|---|
| 7,176,481 B2 * | 2/2007 | Chen et al. | 257/19 |
| 7,407,860 B2 * | 8/2008 | Kim et al. | 438/300 |
| 7,408,182 B1 * | 8/2008 | Smart et al. | 257/13 |
| 2005/0148144 A1 * | 7/2005 | Chou et al. | 438/289 |
| 2005/0287752 A1 * | 12/2005 | Nouri et al. | 438/303 |
| 2006/0038230 A1 * | 2/2006 | Ueno et al. | 257/351 |
| 2007/0007564 A1 * | 1/2007 | Hayashi et al. | 257/295 |
| 2007/0032003 A1 * | 2/2007 | Zhang et al. | 438/197 |
| 2007/0093033 A1 * | 4/2007 | Wang et al. | 438/303 |

* cited by examiner

*Primary Examiner* — Charles Garber
*Assistant Examiner* — Abdulfattah Mustapha
(74) *Attorney, Agent, or Firm* — Yuanmin Cai (57) ABSTRACT

Embodiments of the invention provide a method of forming a field-effect-transistor (FET). The method includes implanting one or more n-type dopants to create one or more implanted regions with at least a portion of the implanted regions being designated as regions for forming source and drain extensions of the FET; activating the implanted regions; etching with a chlorine based etchant to create openings in the implanted regions, and forming the source and drain extensions by exptaxially growing embedded silicon germanium in the openings. Structure of a semiconductor field-effect-transistor made thereof is also provided.

20 Claims, 11 Drawing Sheets

METHOD OF FORMING SOURCE AND DRAIN OF FIELD-EFFECT-TRANSISTOR AND STRUCTURE THEREOF

CROSS-REFERENCE TO RELATED APPLICATION

The present invention claims priority of a U.S. provisional patent application Ser. No. 60/884,080, filed Jan. 9, 2007, entitled "Novel Embedded Extension SiGe Process for PFET Performance Enhancement", the content of which is incorporated herein by reference in its entirety.

FIELD OF THE INVENTION

The present invention relates generally to the manufacturing of semiconductor devices, and in particular, to the formation of source and drain of a field-effect-transistor.

BACKGROUND OF THE INVENTION

In the field of semiconductor integrated circuit (IC) manufacturing, active semiconductor devices, e.g. transistors, are generally manufactured or formed by applying well-known front end of line (FEOL) technologies. A transistor may be a field-effect-transistor (FET), e.g. a complementary metal-oxide-semiconductor (CMOS) FET, and the FET may be a p-type doped FET (pFET) or an n-type doped FET (nFET). Different types of transistors may be manufactured on a common substrate of semiconductor chip or structure.

In most recent several years, efforts of continuing to scale FET devices have been mainly focused on the area of stress engineering. For example, in the case of manufacturing pFET devices, incorporation of compressive stress liners and/or stressors of embedded SiGe (eSiGe) in source and drain regions have successfully demonstrated improvement in performance of the pFET devices. In order to further enhance performance of the pFET devices, new techniques may need to be developed and incorporated into the existing FEOL technology and, in certain situations, careful optimization of current technology elements may need to be performed.

It is well-known in the art that increasing Ge concentration in the eSiGi as well as bringing eSiGe stressor closer to the channel region of a pFET device may result in certain desirably higher strain in the channel, which in turn may improve performance of the device. However, it is also known in the art that, with the current FEOL technology, there are certain practical limitations on the level of Ge concentration that may be used before strain relaxation occurs as well as limitations to the proximity that eSiGe stressor in the source and drain regions may be brought relatively close to the channel region.

Therefore, there exists in the art a need to develop new method, and structures associated with the method, to further enhance the strain effect of eSiGe stressor without degrading performance of a pFET such as, for example, parasitic and punch-through characteristics of the pFET.

SUMMARY OF THE INVENTION

Embodiment of the present invention provides a method of forming a field-effect-transistor (FET). The method includes the steps of implanting one or more n-type dopants to create one or more implanted regions, at least a portion of the implanted regions being designated as regions for forming source and drain extensions of the FET; activating the implanted regions; etching with a chlorine based etchant to create a first set of openings in the portion of the implanted regions for forming the source and drain extensions; and forming the source and drain extensions of the FET by growing silicon germanium (SiGe) in the set of openings.

One embodiment of the method includes forming a first set of spacers adjacent to a gate region of the FET to define edges of the regions for the source and drain extensions, before implanting the one or more n-type dopants; forming a second set of spacers adjacent to the first set of spacers, the second set of spacers covering the portion of implanted regions for the source and drain extensions. Another embodiment includes etching a portion of the implanted regions not covered by the second set of spacers to create a second set of openings for forming source and drain of the FET. Yet another embodiment includes forming the source and drain extensions by growing SiGe epitaxially in the set of openings.

According to embodiments of the present invention, the field-effect-transistor is a p-type doped FET, wherein activating the implanted regions includes annealing the implanted regions at a temperature between about 600° C. and about 1300° C., and for a time duration ranging from about a millisecond to about 30 minutes. In addition, the one or more n-type dopants are selected from a group consisting of As, Sb, and P.

Structures of the field-effect-transistor manufactured according to embodiments of methods of the present invention are also provided.

BRIEF DESCRIPTION OF THE DRAWINGS

The present invention will be understood and appreciated more fully from the following detailed description of the invention, taken in conjunction with the accompanying drawings of which.

It will be appreciated by a person skilled in the art that for simplicity reason and for clarity of illustration, elements shown in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure the embodiments of the invention.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

Figure 1A:
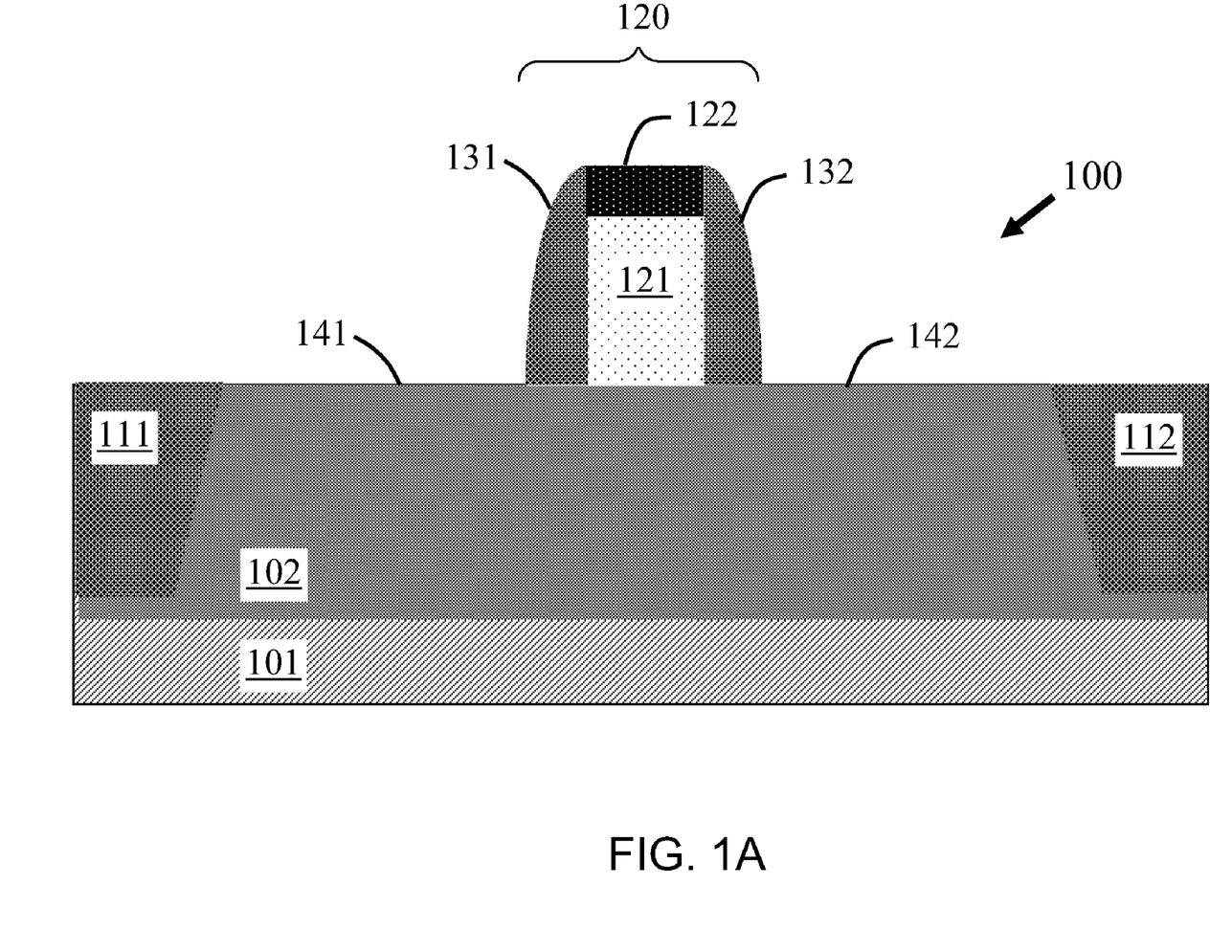
FIGS. 1A-1C are demonstrative illustrations of a method of creating recesses in source and drain regions of a field-effect-transistor according to one embodiment of the present invention.
Figure 1B:
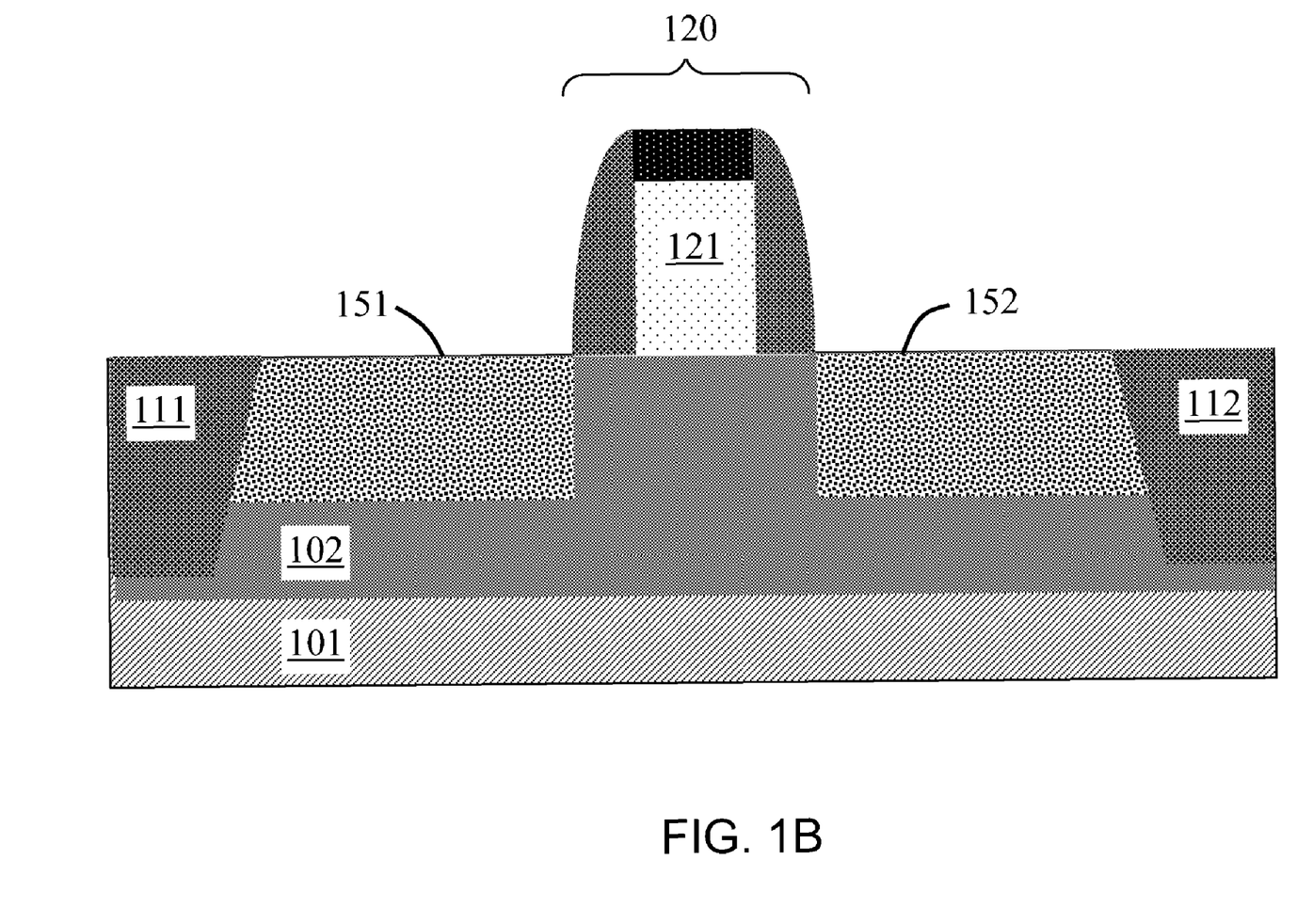
Figure 1C:
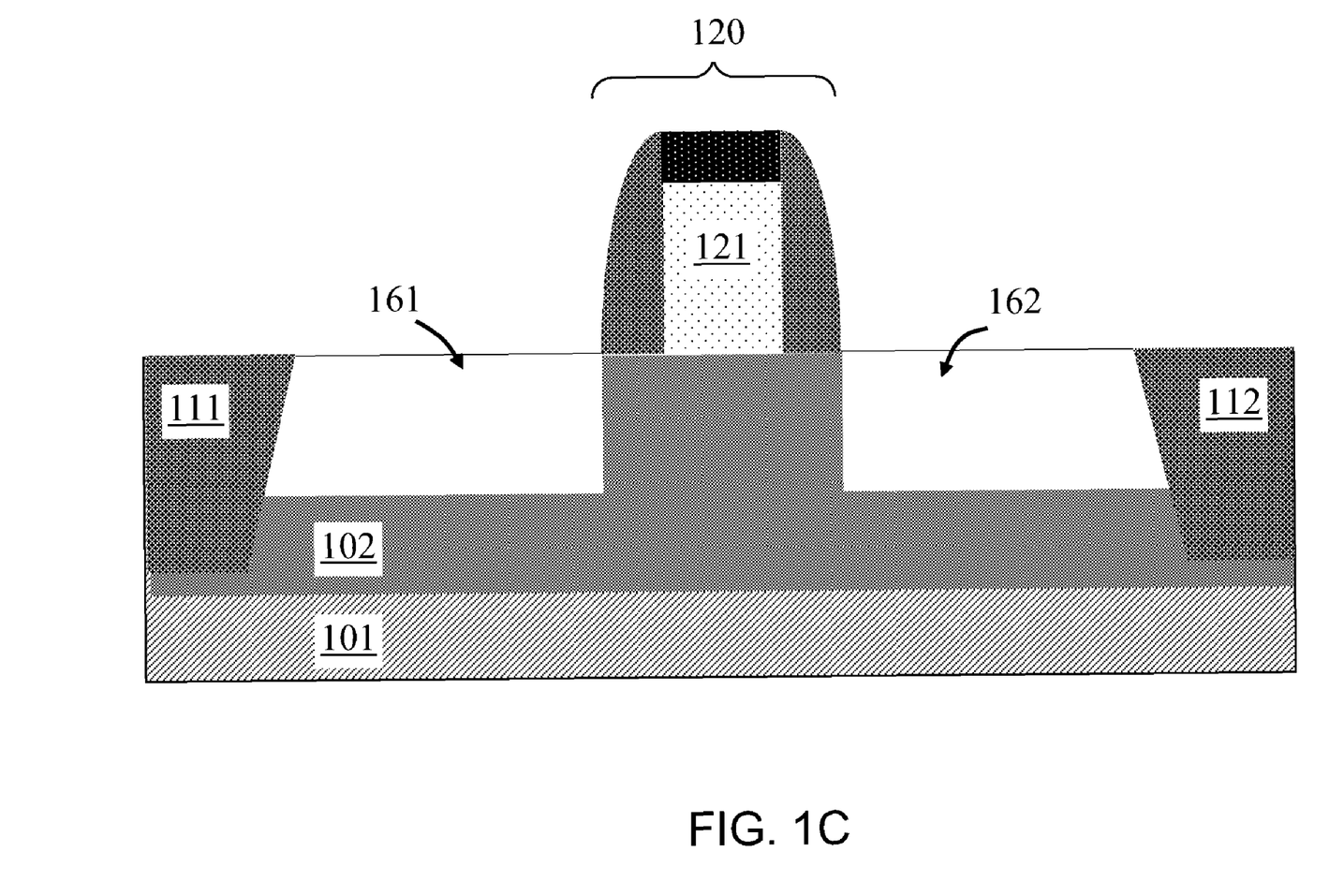

FIGS. 1A-1C are demonstrative illustrations of a method of creating recesses in source and drain regions of a field-effect-transistor (FET) according to one embodiment of the present invention. More specifically, FIG. 1A illustrates a step of forming a gate structure 120 on a top surface of an N-well substrate 102/101 during a process of manufacturing a p-type FET (PFET) 100. Gate structure 120 may be formed in between regions 141 and 142 which are regions designated for forming source and drain of pFET 100. Regions 141 and 142 may be separated from other FET or semiconductor devices on the same substrate 102. The separation may be through one or more shallow trench isolations (STI), e.g., STI 111 and 112 as shown in FIG. 1A, formed in substrate 102.

Gate structure 120 may include a gate dielectric 121, a top portion of which may be salicided to form a silicide 122. Gate structure 120 may also include one or more sets of spacers, for example spacers 131 and 132, formed adjacent to gate dielectric 121 and silicide 122. Between the outer edge of spacers 131 and 132 and the shallow trench isolations 111 and 112 may be defined the source and drain regions 141 and 142 wherein ion implantation may be performed in a next step, according to one embodiment of the invention, as described below in more detail.

Following the step illustrated in FIG. 1A, FIG. 1B illustrates a next step of performing ion implantation, according to one embodiment of the present invention, in the process of manufacturing pFET 100. As is illustrated in FIG. 1B, source/drain regions 141 and 142 may be implanted to become implanted regions 151 and 152 by using one or more n-type dopants such as, for example, As, Sb, and/or P. However, the present invention is not limited in this respect and other n-type dopants may be equally used in the ion implantation process. Furthermore, the type of dopants may not be limited to n-type so long as the implanted regions (with the dopant) may be selectively (as compared to regions that are not implanted) etched away in a next step by, for example, applying a chlorine base etchant or other suitable types of etchants.

The areas of implanted regions 151 and 152 may be defined and/or controlled, as is described above, as between spacers 131, 132 and shallow trench isolations 111, 112. The shape and depth of implantation may be controlled and/or adjusted by varying the angle, and the energy used in the process of ion implantation. For example, a relationship between the depths of implantation and energy used may be pre-determined by performing a test implantation and characterizing the implantation results using well known techniques. The characterized relationship between depth and energy used may then be applied to the actual implantation of regions 141 and 142 to achieve desired shapes and depths of the implantation.

Following the step illustrated in FIG. 1B, FIG. 1C illustrates a next step of etching implanted regions, according to one embodiment of the present invention, in the process of manufacturing pFET 100. More specifically, following ion implantation, n-type dopants in the implanted source and drain regions 151 and 152 may be preferably activated first. The activation may be through, for example, an annealing process conducted at an elevated appropriate temperature. However, the present invention is not limited in this respect. A person skilled in the art may recognize that other activation process such as, for example, hot implant (substrate is heated during implantation) may also be used. Specifically, implanted regions 151 and 152 may be annealed at a temperature from preferably around 600° C. to around 1300° C., depending on the specific annealing technique used. Temperatures outside the above specified range may also be possible. Duration time for the annealing may vary, from sub-millisecond to less than an hour, also depending on the specific annealing technique used. In general, a higher temperature annealing requires a shorter duration. For instance, a laser annealing at 1300° C. may require only a couple of millisecond. Following activation, the implanted regions 151 and 152 may be etched in a chlorine based etchant, creating openings or recesses 161 and 162 as shown in FIG. 1C.

According to embodiments of the present invention, openings or recesses 161 and 162 may be controlled, in combination with other spacer technique, through controlling the regions where the n-type dopant may be implanted to have pre-determined or desired shapes that enable forming stressors, such as embedded SiGe, in positions much closer to the channel region underneath gate dielectric 121. Accordingly, embodiments of the present invention may improve the effectiveness of strain applied by the stressors significantly, as described below in further details.

Figure 2A:
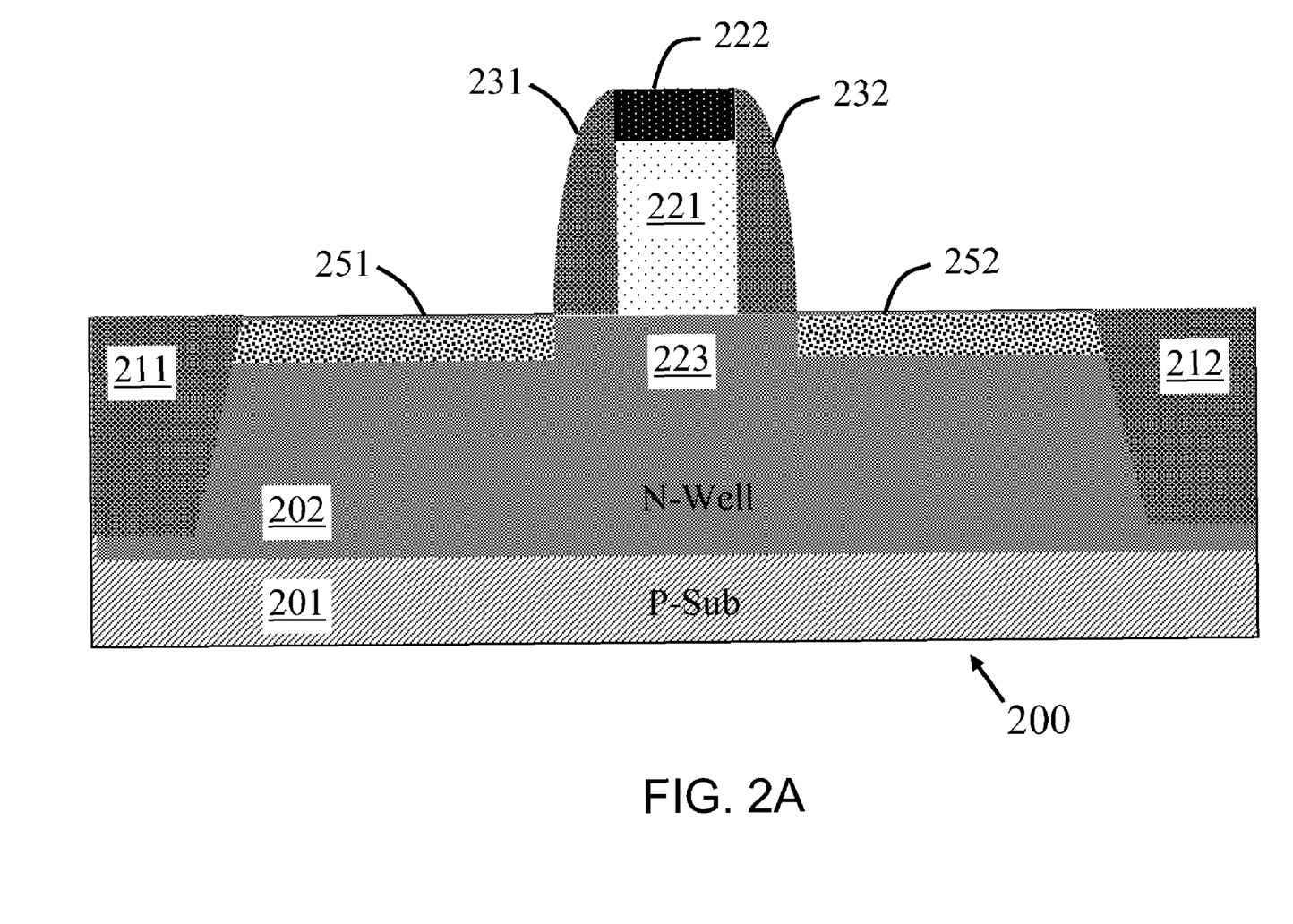
FIGS. 2A-2F are demonstrative illustrations of a method of forming source and drain of a field-effect-transistor according to another embodiment of the present invention.

FIGS. 2A-2F are demonstrative illustrations of a method of forming source and drain of a field-effect-transistor according to another embodiment of the present invention. For example, FIG. 2A illustrates a step of forming a gate structure 220 (FIG. 2B) of a p-type FET 200 on an N-well substrate 202/201. Gate structure 220 includes a gate dielectric 221, a top portion of which may be salicided to include a silicide 222, and a first set of spacers 231 and 232. Between spacer 231 and a STI 211, and between spacer 232 and a STI 212, defines how closely embedded SiGe stressors (to be formed later as part of source and drain and their extensions) may be formed close to the channel region of pFET 200.

In addition, FIG. 2A illustrates that areas close to the surface of source and drain regions may be implanted, at least partially, by one or more n-type dopants (such as As, Sb, and/or P as described above with reference to FIGS. 1A-1C) to become implanted regions 251 and 252. Implanted regions 251 and 252 may include source and drain regions (261/262, FIG. 2D) and their respective extension regions (263/264, FIG. 2D) of pFET 200, as described below in more detail. According to one embodiment, edges of spacers 231 and 232 may define and determine how closely implanted regions 251 and 252, in particular source and drain extension regions 263 and 264, may be formed to the channel region 223 under gate dielectric 221. The formation of implanted regions 251 and 252 may be subsequently followed by an activation process to activate the dopants implanted. The activation process may include any suitable processes and/or methods such as, for example, an annealing process.

Figure 2B:
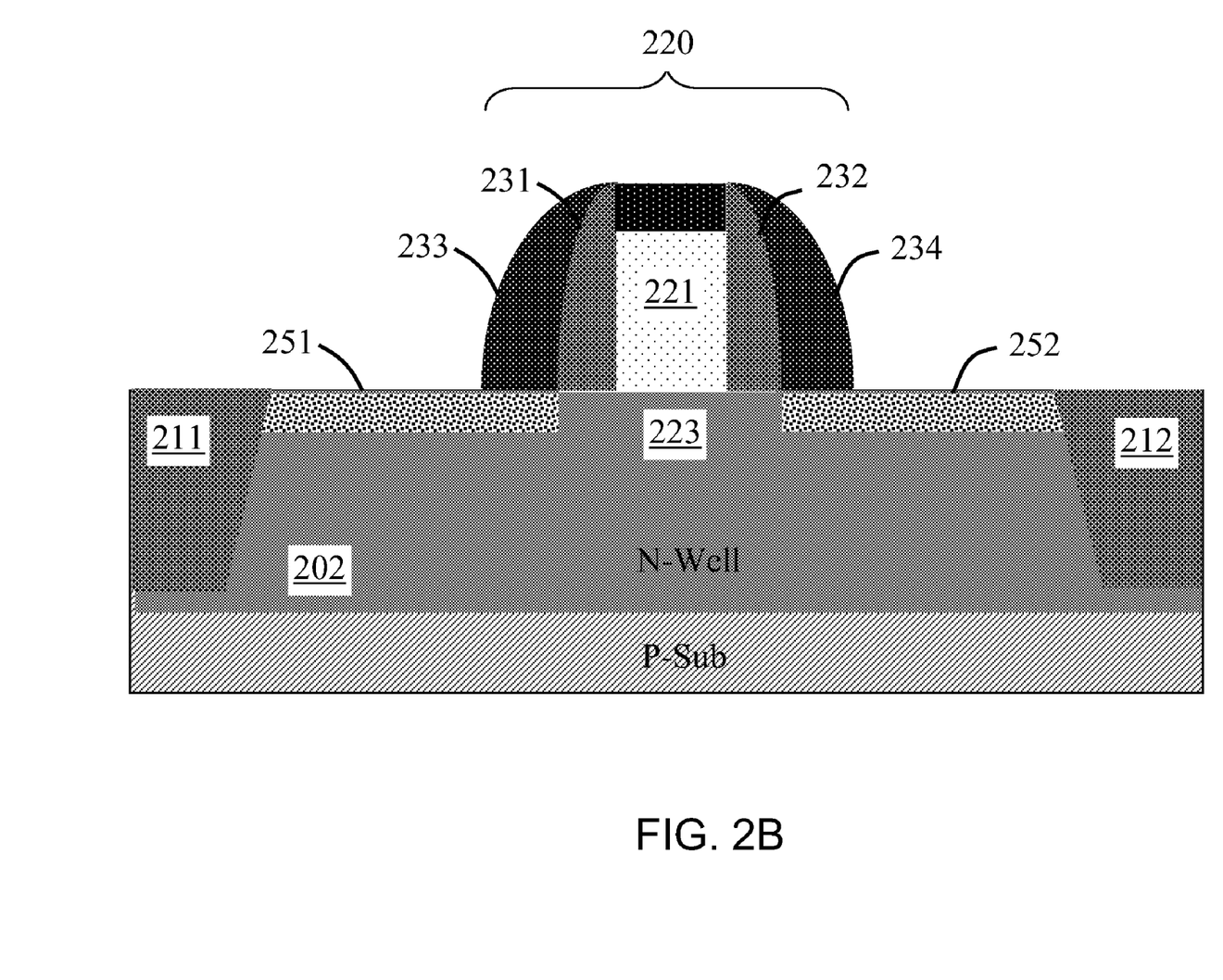

FIG. 2B illustrates a step of manufacturing pFET 200 following the step shown in FIG. 2A according to embodiments of the present invention. Following the formation of implanted regions 251 and 252, a second set of spacers 233 and 234 may be formed in positions adjacent to the first set of spacers 231 and 232. The edges of second set of spacers 233 and 234 define where source and drain of pFET 200 may be formed according to one embodiment of the present invention. Underneath the second set of spacers 233 and 234 define the extension regions of source and drain of pFET 200, where the implantation may be later replaced with stressors, as described below in more detail, to apply stress more closely to the channel region 223 of pFET 200. A person skilled in the art will appreciate that although only two sets of spacers have been shown in FIG. 2B, a combination of multiple sets of spacers may be used to define both the implanted regions 251, 252 (which include the source/drain and their extension regions) and the source/drain regions 261 and 262 (FIG. 2C).

Figure 2C:
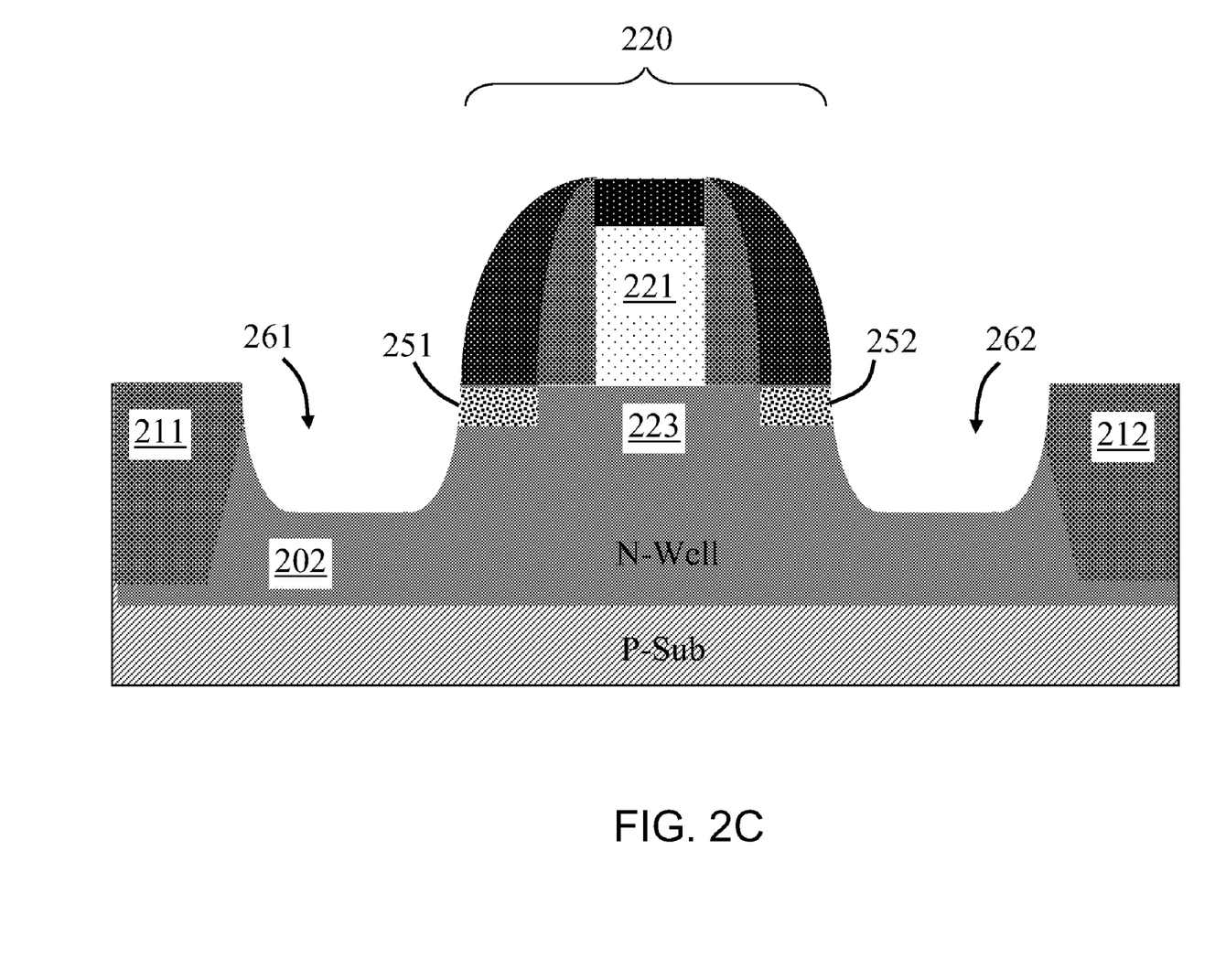

FIG. 2C illustrates a further step of manufacturing pFET 200 following the step shown in FIG. 2B according to embodiments of the present invention. In FIG. 2C, the implanted regions not covered by the second set of spacers 233 and 234, and a portion of substrate 202 underneath may be etched away to create openings 261 and 262, wherein source and drain of pFET 200 may be formed later. The etching may be performed by applying well-known etch techniques such as, for example, fluorine based reactive-ion-etch (RIE). In one embodiment, the RIE etching is anisotropic and directional and after the etching process, implanted regions 251 and 252 under second set of spacers 233 and 234 remain intact.

Figure 2D:
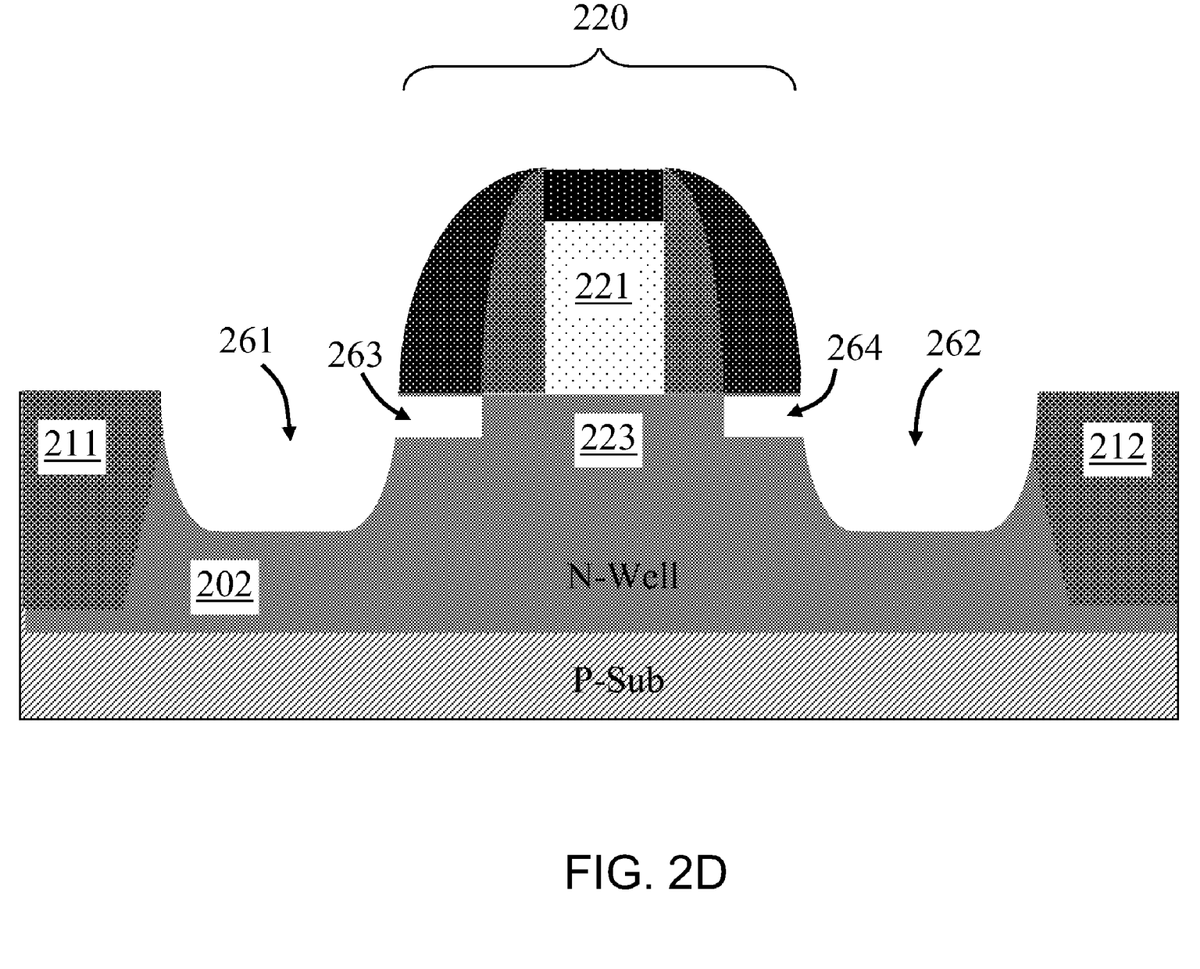

FIG. 2D illustrates a step of manufacturing pFET 200 following the step shown in FIG. 2C according to embodiments of the present invention. During this step, implanted regions 251 and 252 may be etched away by applying chlorine based etchant to create openings 263 and 264 therein. The openings 263 and 264 may be later filled with silicon germanium (SiGe) in a subsequent step. The SiGe stressor may become embedded (eSiGe) in the source and drain regions, and thus may apply stress more closely to the channel region 223 of pFET 200, under gate dielectric 221.

Figure 2E:
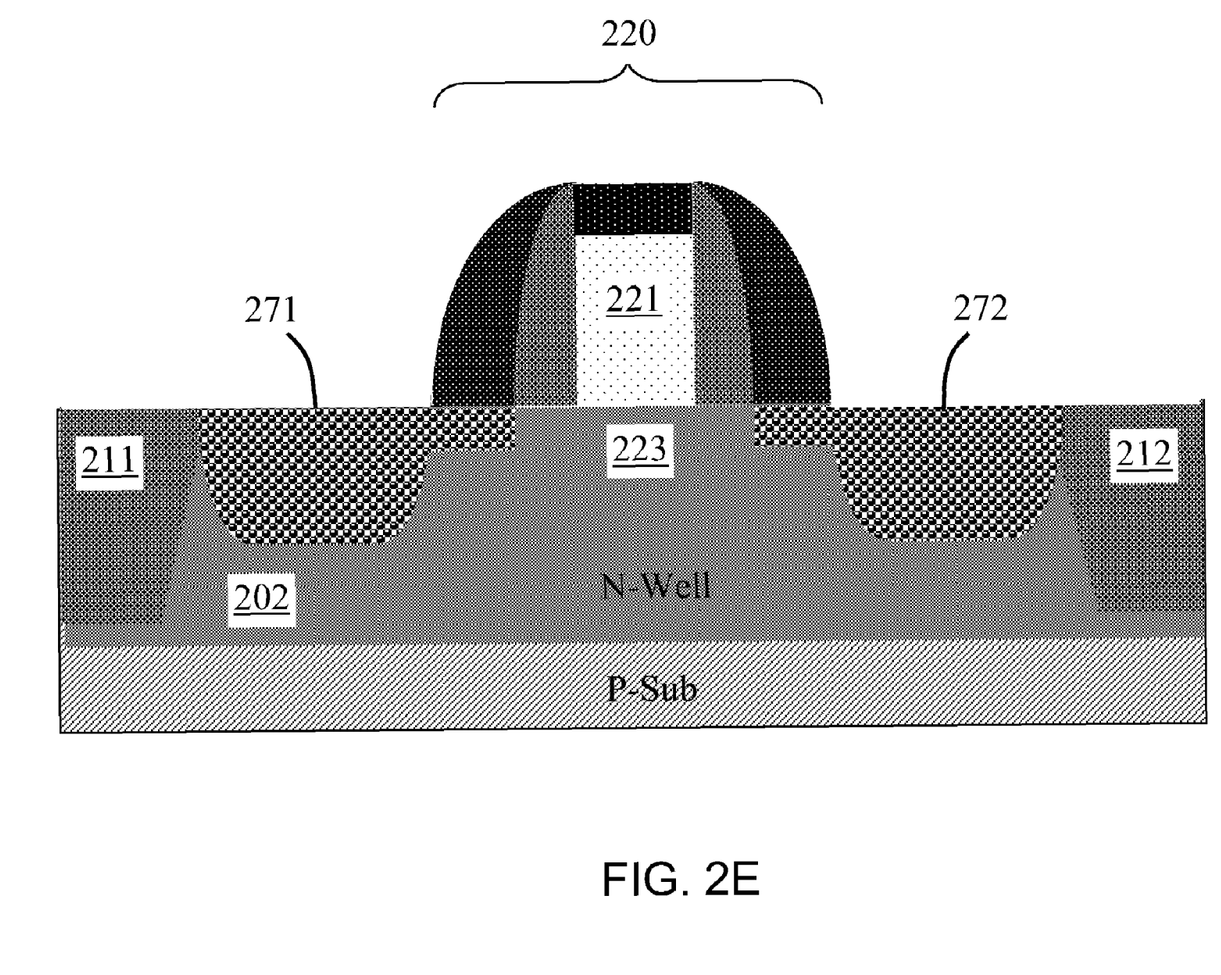

FIG. 2E illustrates a step of manufacturing pFET 200 following the step shown in FIG. 2D according to embodiments of the present invention. During this step, source and drain of pFET 200 may be formed in openings 261 and 263, and openings 262 and 264 created in previous steps. Being able to exert compressive stresses to the surrounding areas, embedded SiGe may be grown through, for example, epitaxial growth or deposition in the openings 261-264 to form source and drain 271 and 272. According to one embodiment of the present invention and as is clearly illustrated in FIG. 2D, eSiGe formed in the openings of 263 and 264 may act as stressors and apply compressive stress towards the channel region 223 under gate dielectric 221 in positions that are much closer than those formed in the openings of 261 and 262.

Figure 2F:
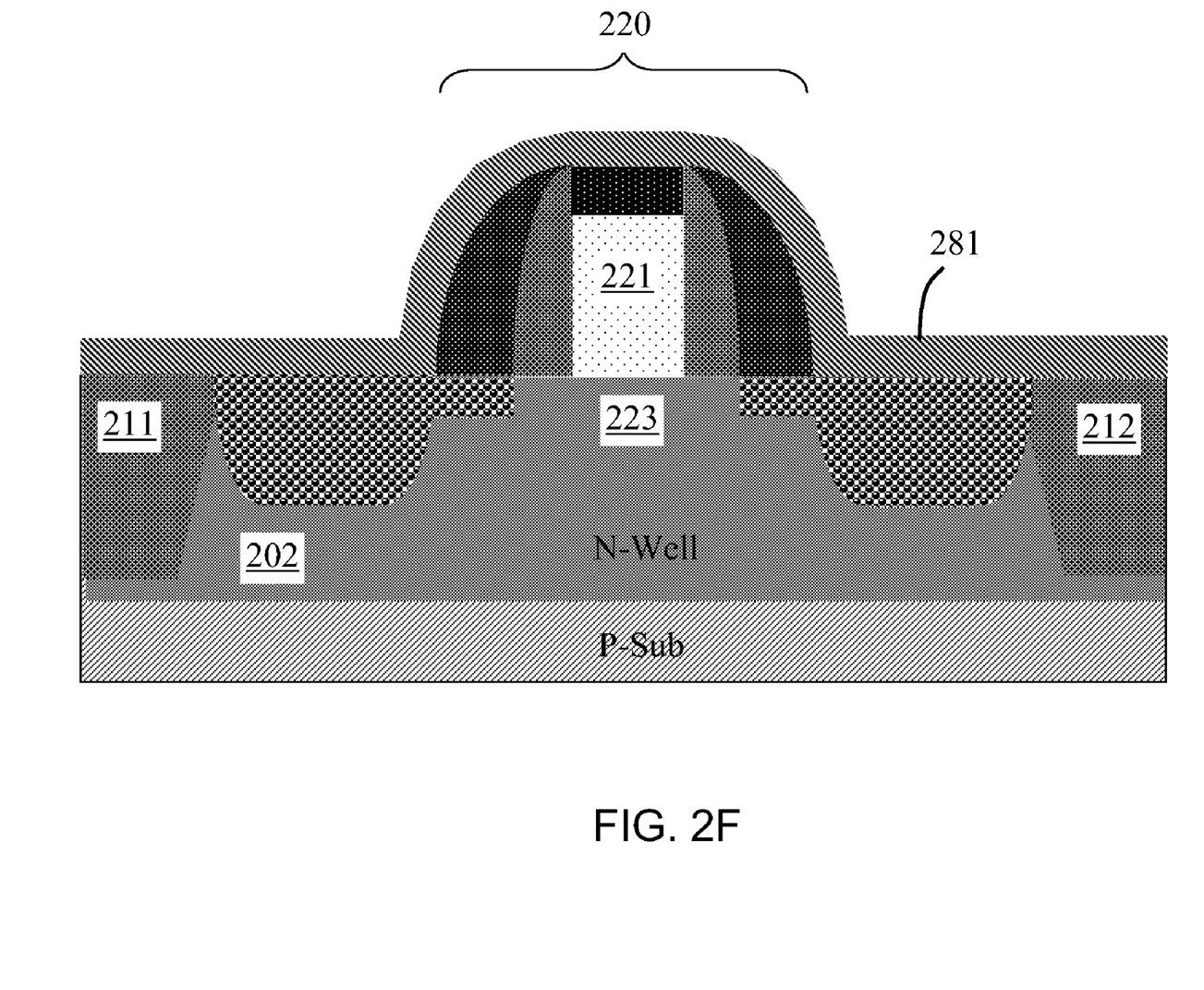

Following the growth of SiGe in the source and drain regions, as illustrated in FIG. 2F, a stress liner (or more specifically a compressive stress liner) may be optionally formed, as is well known in the art, on top of the gate structure to further enhance the stress effect being applied to the channel region 223 of gate 220. Other stress engineering techniques may be used as well.

Figure 3:
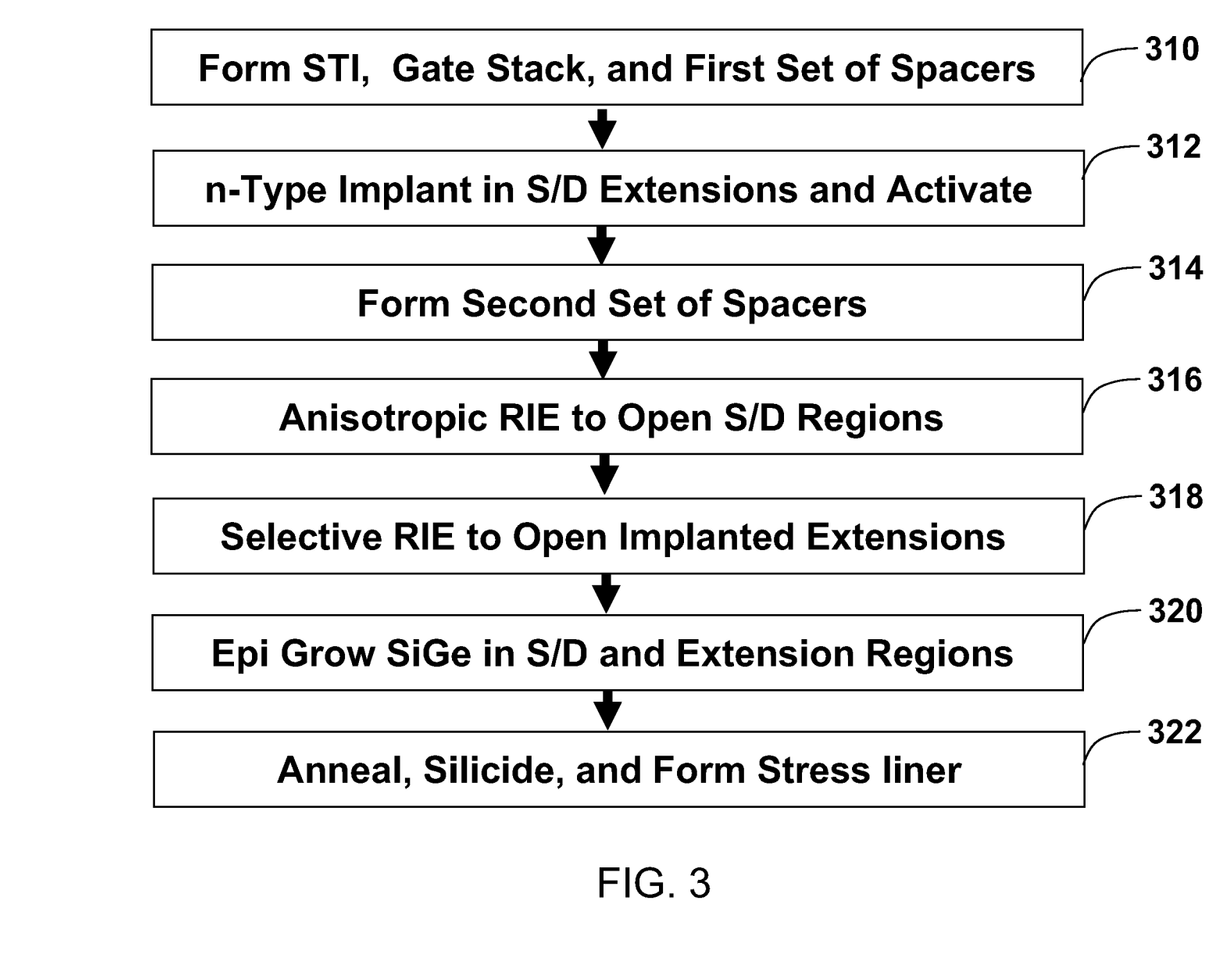
FIG. 3 is a simplified flowchart of a method of forming source and drain of a field-effect-transistor according to a further embodiment of the present invention.

FIG. 3 is a simplified flowchart of a method of forming source and drain of a field-effect-transistor (FET) according to one embodiment of the present invention. More specifically, at operation 310, a FET device (preferably a p-type FET) may be partially formed by forming shallow trench isolations, a gate stack, and a first set of spacers adjacent to the gate stack, all on a semiconductor substrate (FIG. 2A). Operation 310 may be followed by operation 312, in which an n-type dopant or dopants may be implanted in regions of the FET that are regions designated for forming source and drain and their extensions (FIG. 2A). The n-type dopants may include, for example, As, Sp, and/or P but other types of dopants in particular n-type dopants may be used as well. The implantation may be followed by an activation process such as, for example, an annealing process, to activate the dopants implanted. Following the implantation and activation of the dopants, a second set of spacers may be formed next to, and adjacent to the first set of spacers at operation 314 (FIG. 2B). However, the invention is not limited in this respect and a combination of multiple sets of spacers may be used as well. After forming the second set of spacers which define the source and drain regions and covers the source and drain extension regions, an anisotropic etching process, such as the conventional fluorine based reactive-ion-etching (RIE) process, may be used at operation 316 to create openings in the designated source and drain regions (FIG. 2C). After forming the openings of the source and drain regions, a selective RIE process applying a chlorine-based etching may be used at operation 318 to further open the source and drain extension regions (FIG. 2D), which have been previously implanted with n-type dopants and may be underneath the second set of spacers. At a following operation 320, the openings of source and drain regions and source and drain extension regions may be filled with semiconductor materials such as SiGe (FIG. 2E), which may be epitaxially grown or deposited as is well-known in the art, to form the source and drain of the FET. The formation of source and drain of the FET may be followed by other well-known conventional operations, as indicated in operation 322, such as an annealing process and silicidation process to finish the FET device. Optionally, a compressive stress liner may be formed, such as through deposition, on top of the FET device to further enhance the stress applied to the channel region of the FET.

Figure 4:
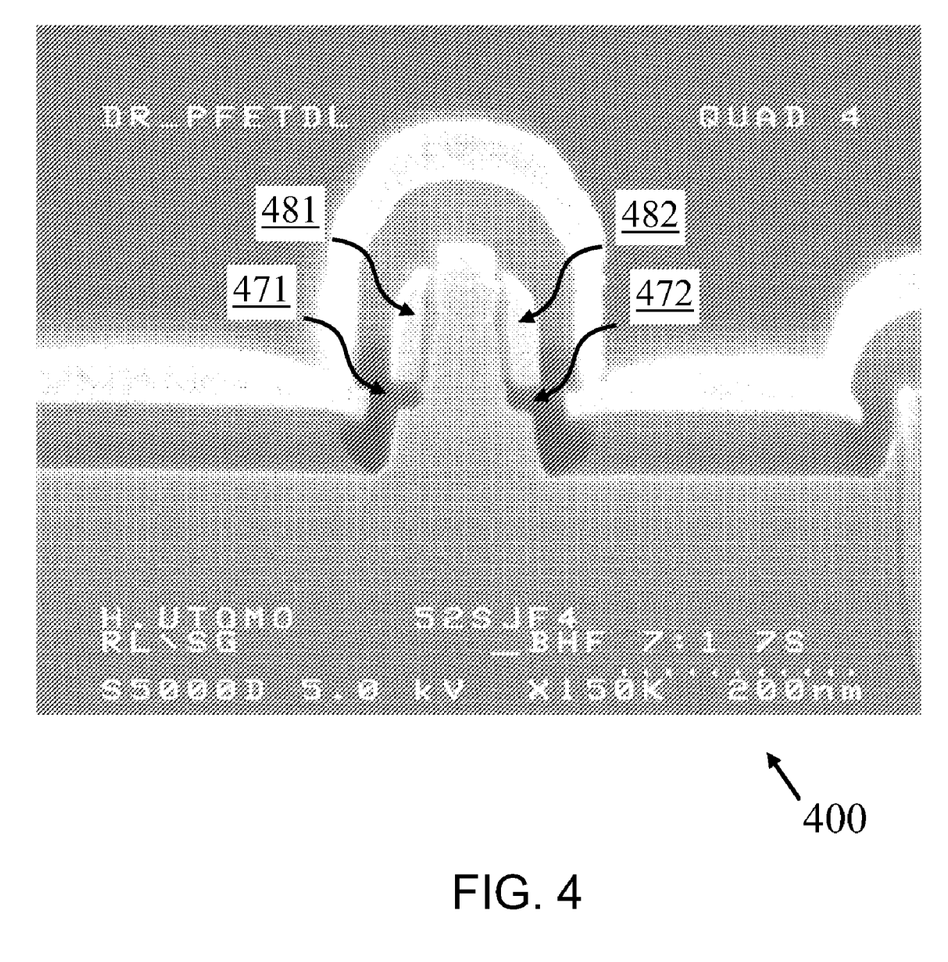
FIG. 4 is a sample SEM image of cross-section of a field-effect-transistor manufactured according to embodiment of the present invention.

FIG. 4 is a sample SEM image of cross-section of a field-effect-transistor manufactured according to one embodiment of the present invention. A person skilled in the art will appreciate that FET 400 shown in FIG. 4 includes source and drain extension regions 471 and 472, which are filled with embedded SiGe and formed underneath a set of spacers 481 and 482. Stressor of eSiGe are placed much closer to the channel region of the field-effect-transistor.

While the invention has been described in terms of exemplary embodiments, those skilled in the art will recognize that the invention can be practiced with modifications and in the spirit and scope of the appended claims.

What is claimed is:

1. A method of forming a field-effect-transistor (FET), comprising:
    implanting one or more n-type dopants to create one or more implanted regions, at least a portion of said implanted regions being designated as regions for forming source and drain extensions of said FET;
    activating said implanted regions;
    etching with a chlorine based etchant to remove said implanted regions entirely thereby creating a set of openings in said portion of said implanted regions for forming said source and drain extensions; and
    forming said source and drain extensions of said FET by growing silicon germanium (SiGe) in said set of openings.

2. The method of claim 1, further comprising forming a set of spacers adjacent to a gate region of said FET to define edges of said regions for said source and drain extensions, before implanting said one or more n-type dopants.

3. The method of claim 2, wherein said set of spacers is a first set of spacers, further comprising forming a second set of spacers adjacent to said first set of spacers, said second set of spacers covering said portion of implanted regions for said source and drain extensions.

4. The method of claim 3, wherein said set of openings is a first set of openings, further comprising etching a portion of said implanted regions not covered by said second set of spacers to create a second set of openings for forming source and drain of said FET.

5. The method of claim 4, further comprising forming said source and drain of said FET by growing SiGe in said second set of openings.

6. The method of claim 5, wherein said second set of openings is deeper than, and adjacent to said first set of openings.

7. The method of claim 5, comprising annealing said FET after forming said source and drain and said source and drain extensions through growing SiGe in said first and second sets of openings.

8. The method of claim 1, wherein said FET is a p-type doped FET and forming said source and drain extensions comprises growing SiGe epitaxially in said set of openings.

9. The method of claim 1, wherein activating said implanted regions comprises annealing said implanted regions at a temperature between about 600° C. and about 1300° C., and for a time duration ranging from about a millisecond to about 30 minutes.

10. The method of claim 1, wherein said one or more n-type dopants are selected from a group consisting of As, Sb, and P.

11. A method of forming a field-effect-transistor (FET), comprising:
    implanting one or more dopants to create one or more implanted regions, said implanted regions covering at least regions designated for forming source and drain extensions of said FET;
    activating said implanted regions;
    creating openings for said source and drain extensions by using a chlorine based etchant selective to said one or more dopants to remove entirely said implanted regions; and
    forming said source and drain extensions in said openings.

12. The method of claim 11, comprising forming a first set of spacers adjacent to a gate region of said FET to define regions for said source and drain extensions, and forming a second set of spacers adjacent to said first set of spacers to define regions for source and drain of said FET.

13. The method of claim 12, comprising etching said implanted regions not covered by said second set of spacers to create openings for forming said source and drain of said FET.

14. The method of claim 13, comprising forming said source and drain as well as source and drain extensions by epitaxially growing silicon germanium in said openings.

15. The method of claim 11, wherein activating said implanted regions comprises annealing said implanted regions at a temperature between about 600° C. and about 1300° C., and for a time duration ranging from about a millisecond to about 30 minutes.

16. The method of claim 11, wherein said one or more dopants are n-type dopants selected from a group consisting of As, Sb, and P.

17. The method of claim 16, wherein said etchant is chlorine based etchant that provides selective etching to said n-type dopants.

18. A method of forming a field-effect-transistor (FET), comprising:
    creating implanted regions designated for source and drain extensions of said FET by implanting one or more n-type dopants in regions next to a first set of spacers adjacent to a gate region of said FET;
    activating said implanted regions;
    covering said source and drain extension regions with a second set of spacers;
    removing at least said implanted regions entirely underneath said second set of spacers through etching with a chlorine based etchant to create openings; and
    forming said source and drain extensions in said openings.

19. The method of claim 18, wherein forming said source and drain extensions comprises growing silicon germanium (SiGe) epitaxially in said openings.

20. The method of claim 19, further comprising etching said implanted regions not covered by said second set of spacers to create openings and growing therein SiGe to form source and drain of said FET.

* * * * *